United States Patent [19]
Hawkins et al.

[11] Patent Number: 5,428,498
[45] Date of Patent: Jun. 27, 1995

[54] OFFICE ENVIRONMENT LEVEL ELECTROSTATIC DISCHARGE PROTECTION

[75] Inventors: William G. Hawkins, Webster; Cathie J. Burke; Thomas E. Watrobski, both of Rochester; Thomas A. Tellier, Williamson; Sophie Vandebroek, Penfield, all of N.Y.

[73] Assignee: Xerox Corporation, Stamford, Conn.

[21] Appl. No.: 952,015

[22] Filed: Sep. 28, 1992

[51] Int. Cl.⁶ .................................................. H02H 3/22
[52] U.S. Cl. ..................................... 361/212; 361/56; 361/118; 361/220
[58] Field of Search ............... 361/56, 111, 118, 212, 361/220

[56] References Cited

U.S. PATENT DOCUMENTS

| | | | |
|---|---|---|---|
| 3,626,249 | 12/1971 | Snedeker | 361/56 |
| 3,787,717 | 6/1974 | Fischer et al. | 361/56 X |
| 4,616,243 | 10/1986 | Minato et al. | 257/357 |
| 4,725,915 | 2/1988 | Jwahashi et al. | 361/91 |
| 4,803,536 | 2/1989 | Tuan | 257/61 |
| 4,897,757 | 1/1990 | Taillet et al. | 361/91 |
| 4,947,192 | 8/1990 | Hawkins et al. | 346/140 R |
| 4,987,465 | 1/1991 | Longcor et al. | 361/91 X |
| 4,990,984 | 2/1991 | Misu | 257/360 |
| 5,010,355 | 4/1991 | Hawkins et al. | 346/140 R |
| 5,027,252 | 6/1991 | Yamamura | 361/58 |
| 5,063,655 | 11/1991 | Lamey et al. | 29/611 |
| 5,075,250 | 12/1991 | Hawkins et al. | 437/52 |
| 5,212,618 | 5/1993 | O'Neill et al. | 361/56 |
| 5,218,222 | 6/1993 | Roberts | 257/362 |
| 5,229,635 | 7/1993 | Bessolo et al. | 257/360 |

FOREIGN PATENT DOCUMENTS

| | | | |
|---|---|---|---|
| 0313722 | 5/1989 | European Pat. Off. | 361/212 |
| 2090701 | 9/1984 | United Kingdom | 361/56 |

OTHER PUBLICATIONS

IBM Technical Disclosure Bulletin, vol. 18, No. 2, Jul. 1975, Lateral Transistors as Active Guard Ring in FET Circuits, Clemen et al.

*Primary Examiner*—A. D. Pellinen
*Assistant Examiner*—Fritz M. Fleming
*Attorney, Agent, or Firm*—R. Hutter

[57] ABSTRACT

An electrostatic discharge protection device for a connector associated with an integrated circuit chip, particularly one associated with a thermal ink-jet printhead. A MOS field effect device extends along at least one edge of the connector on the chip. A bipolar transistor, parasitic to the field effect device, conducts current from the connector to ground in response to a voltage between the connector and ground in excess of a predetermined threshold. A zone of a predetermined electrical resistance is operatively disposed between the bipolar transistor and ground. The zone may substantially encircle the bonding pad of the connector to evenly distribute local incidences of high voltage. The invention enables integrated circuits to pass ESD requirements of office products, which is 15 kV by Human Body Model testing.

13 Claims, 4 Drawing Sheets

OFFICE ENVIRONMENT LEVEL ELECTROSTATIC DISCHARGE PROTECTION

RELATION TO OTHER APPLICATIONS

The present application incorporates by reference Pending U.S. patent application Ser. No. 07/879,626, filed May 6, 1992, and assigned to the assignee of the present application. Also incorporated herein by reference are the following U.S. Patents, also assigned to the assignee of the present application: U.S. Pat. No. 4,947,192, and U.S. Pat. No. 5,075,250.

FIELD OF THE INVENTION

The present invention relates to electrostatic discharge protection of electrical components to a level sufficient for handling in an office environment. More specifically, the present invention relates to a technique of emitter ballasting for avoiding a common type of failure in the vicinity of a bonding pad of a thermal ink-jet printhead.

BACKGROUND OF THE INVENTION

Electrostatic discharge (ESD) protection is a common and important requirement for many types of electrical equipment. The familiar "electric shock" experienced by a person touching an object, for example, on a day of low humidity, is just the type of electrostatic discharge which can cause malfunction or damage in any apparatus with sensitive electrical circuitry. A typical discharge caused by touching can be in the range of 10,000 volts, and result in current flow of several amperes for about 1 $\mu$sec or less. Such a high voltage applied anywhere to an electrical apparatus designed to be sensitive to small voltages is likely to damage, or at least cause a malfunction of, such an apparatus.

One type of electrical apparatus that is sensitive to electrostatic discharges is a thermal ink-jet (TIJ) printhead. Advanced TIJ printers operate by using logic level voltage signals to operate a large number of very small heating elements, which are used to vaporize liquid ink in a corresponding number of small channels or passageways. Thermal ink jet printers are typically designed to have customer-replaceable printheads or print cartridges; ESD protection is necessary to prevent these items from being damaged during handling and machine insertion. In the circuitry for operating an ink-jet printhead, MOS (metal oxide on silicon) technology is often used. Examples of such printhead designs are described in U.S. Pat. No. 5,010,355 to Hawkins et al., U.S. Pat. No. 4,947,192 to Hawkins et al., U.S. Pat. No. 5,075,250 to Hawkins et al., or U.S. Pat. No. 5,063,655 to Lamey et al. A typical resolution of an ink-jet printer is 300 channels or nozzles per inch, each nozzle having a voltage-actuable heating element associated therewith. Experimental printheads with much higher resolution have also been made. It is thus clear that such an apparatus will be sensitive to the relatively large voltages which may be externally created by a typical electrostatic discharge.

It has been found that a common type of failure associated with electrostatic discharges into a thermal ink-jet printhead occurs around the area of a "bonding pad," through which the printhead is connected to an external electronic device. In a printhead using MOS technology, the inputs of the integrated circuit devices are capacitors whose two electrodes are the MOS transistor device channel and the gate electrode material, usually polysilicon. The two capacitor electrodes are separated by silicon dioxide, which is usually grown on the device channel by high temperature oxidation processes. The MOS transistors use a thin silicon dioxide gate insulator to achieve high performance, and this thin oxide is susceptible to catastrophic, irreversible breakdown if the voltage across the dielectric is raised above 20 to 100 volts, depending on device fabrication details.

Numerous conventional systems are known for ESD protection of semiconductor and MOS devices. In general, such circuits use monolithically integrated protective transistors built into the semiconductor circuit to protect the gates of the devices. These protective transistors are arranged to allow a high voltage static discharge transient to pass to ground prior to reaching the protected circuit. For example, U.S. Pat. No. 4,990,984 to Misu discloses a conventional protective transistor ESD protection device for an integrated circuit. Such systems have a disadvantage which prevents them from being applied as protection of thermal ink jet printhead input terminals. The conventional protective transistor for the circuit has only a small current carrying capacity, so that ESD surges which are encountered in the office environment will overwhelm the protective transistor, allowing a part of the ESD surge to reach the protected circuit or causing failure of the ESD protection circuit itself.

When a typical electrostatic discharge protection device is employed around the edges of the bonding pad, which would typically be in the form of a transistor circuit adapted to short out excessive voltages at the pad, the excess voltage tends not to be distributed evenly when it discharges from the pad, but rather tends to concentrate in localized "hot spots" at various points around the edge of the bonding pad, where the high voltages associated with electrostatic discharge pass through one very small area. The hot spot occurs because current conduction increases with temperature so that local fluctuations in device conductivity become greatly amplified. The resulting concentration of current in a small portion of the device causes heating and alloying or "spiking" of the aluminum metallization through the silicon/diffused surface region. There is therefore a need for a device which avoids this specific type of electrostatic discharge failure.

DESCRIPTION OF THE PRIOR ART

U.S. Pat. No. 4,616,243 discloses an electrostatic discharge protection device for a semiconductor chip which avoids the problem of accidentally discharging a data storage node. The invention improves the gate breakdown voltage as viewed from an input terminal by reducing the breakdown voltage of the electrostatic discharge protection transistor and reducing the resistance of the transistor after the breakdown.

U.S. Pat. No. 4,725,915 discloses an electrostatic discharge protection device for a semiconductor chip in which the terminal to be protected is a transistor circuit in which one end of a current path is connected to the drain of a MOS transistor. The avalanche breakdown voltage of the transistor circuit is lower than that of the MOS transistor. When a high voltage is applied to the drain of the MOS transistor, the transistor circuit is made conductive, thereby preventing this high voltage from being continuously applied to the drain of the MOS transistor.

U.S. Pat. No. 4,803,536 discloses an electrostatic discharge protection network for large area transducer arrays. A thin film transistor is associated with each transducer in the array, which creates a resistive path between the transistor gate electrode and one or both of the transistor's other two electrodes.

U.S. Pat. No. 4,990,984 discloses an electrostatic discharge protection device for a semiconductor chip in which a protective transistor includes two channel regions connected in series. A portion of a field insulating layer is provided on one channel region to reduce charging on the drain side of the channel region without affecting the breakdown voltage of the drain region, thereby eliminating a leakage current problem.

U.S. Pat. No. 5,027,252 discloses an electrostatic discharge protection device for a semiconductor chip in which a channel stop is provided between two n-wells to create a punchthrough device.

Other examples of ESD protection devices are cited in the patents and applications incorporated by reference herein.

SUMMARY OF THE INVENTION

In accordance with the present invention, there is provided an electrostatic discharge protection device for a connector associated with an apparatus. A MOS field oxide device is operatively disposed between the connector and ground. Parasitic to the field oxide device is a bipolar transistor, having a collector, an emitter, and a base, and adapted to conduct current through the collector and emitter in response to a voltage between the connector and ground in excess of a predetermined threshold. A zone of a predetermined electrical resistance is operatively disposed between the bipolar transistor and ground, the zone extending along at least one dimension of the connector.

In a second type of protection device, the central contact pad is fully encircled by an ESD suppression circuit such that the impedance between the pad and ground is closely matched everywhere in the device. According to another aspect of the present invention, there is provided an improved ink jet printhead including an ink channel having a nozzle and in communication with an ink supply, a heating element associated with the channel, and a connector connecting to a semiconductor chip containing the heating elements so as to control the heating element to heat the ink in the channel and eject an ink droplet from the nozzle in response thereto. The improvement comprises a protection device, coupled to the connector, to prevent failure of the semiconductor chip and the connector due to electrostatic discharges typically encountered in an office environment.

In the drawings.

BRIEF DESCRIPTION OF THE DRAWINGS

In the Figures, like reference numerals indicate like elements, whether in physical views or schematic diagrams.

While the present invention will hereinafter be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 5:
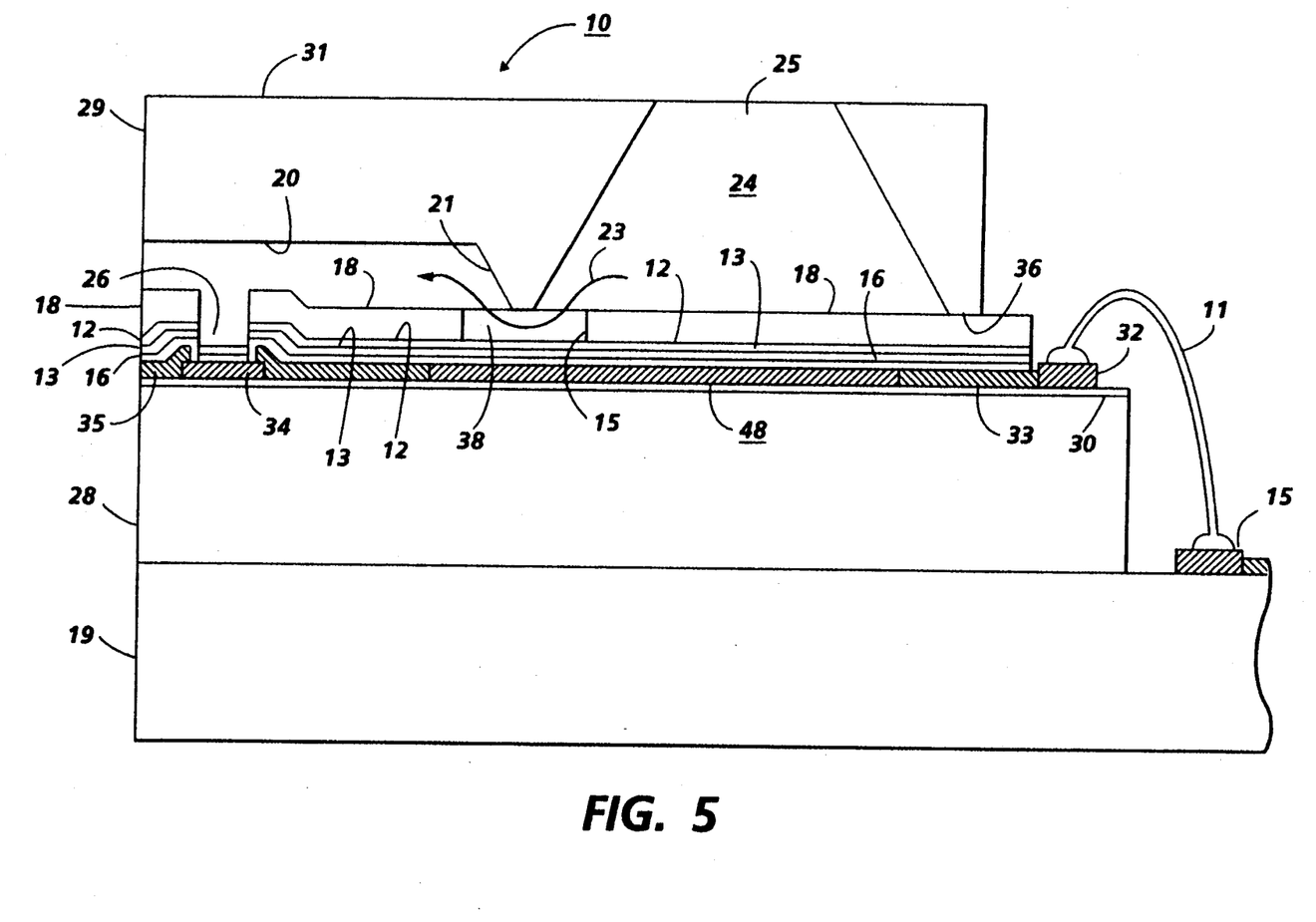
FIG. 5 is a sectional, elevational view of a typical thermal ink-jet printhead.

An enlarged sectional elevational view of an ink-jet printhead 10 incorporating MOS technology is depicted in FIG. 5. The lower semiconductive substrate, or heating element plate 28 has the heating elements or resistors 34, matrix addressing electrodes 33, and MOS drivers 48 produced monolithically on silicon surface 30 thereof, while the upper substrate or channel plate 31 has parallel grooves, one of which is shown as 20, which extend in one direction and penetrate through the left substrate front face 29. The other end of the grooves terminate at slanted wall 21. The through recess 24 is used as the ink supply manifold for the capillary filled ink channels 20 and has an open region 25 for use as an ink fill hole. Ink flows from the manifold 24 and around the end 21 of the channels 20, as depicted by arrow 23. The surface of the channel plate with the channels is aligned and bonded to the heater plate 28, so that a respective one of the plurality of heating elements 34 is positioned in each channel, formed by the grooves and the lower substrate or heater plate. Ink enters the manifold formed by the recess 24 and the lower substrate 28 through the fill hole 25 and, by capillary action, fills the channels 20 by flowing through an elongated recess 38 formed in the optional thick film layer 18 or other means of providing communication between the manifold 24 and channels 20. The ink at each nozzle forms a meniscus, the surface tension in conjunction with negative pressure of which prevents the ink from weeping therefrom.

The active MOS circuitry which is monolithically integrated with the heater elements comprises transistors to switch the heaters on and off. Because the transistor switches are three terminal devices, they can be matrix addressed. Optional addressing logic circuitry can also be included to address power MOSFET switch gates. The control logic can be either NMOS or CMOS. In the case of matrix address circuitry, the power MOSFET gates need to be protected. In the case of logic addressing circuitry, logic gate inputs need to be protected. The MOS transistor switches or drivers 48 and matrix addressing electrodes 33, are located in an area below the ink in the reservoir 24 and channels 20 of the printhead, so that ionic passivation is imperative. For a typical MOS structure usable in this context refer to U.S. Pat. No. 4,947,192 to Hawkins et al., entitled "Monolithic Silicon Integrated Circuit Chip for a Thermal Ink Jet Printer," and also U.S. patent application Ser. No. 07/879,626, filed May 6, 1992, the relevant portions thereof being hereby incorporated into this application.

The matrix addressing electrodes 33 and common return 35 on the lower substrate or heater plate 28 provide interconnection of the MOS driver's source and gate with the electrical signals from the printhead controller (not shown) via terminal 32, known as "bonding pad" 32. The upper substrate or channel plate 31 is smaller than that of the lower substrate in order that the bonding pad 32 is exposed and available for connecting the electrodes 15 on a circuit board 19, by wire bonds 11. The printhead 10 is permanently mounted on either the circuit board or preferably on a heat sink which carries the silicon chip 10 and the circuit board. The daughter board electrodes are connected to the printhead controller. Optional layer 18 is a thick film passivation layer sandwiched between upper and lower substrates. This layer is delineated to expose the heating elements, thus placing them in a pit 26, and is also patterned to form the elongated recess to enable ink flow between the manifold 24 and the ink channels 20. In addition, the thick film insulative layer is removed to expose the bonding pad 32.

It should be understood that the above description of a thermal ink-jet printing apparatus is given to demonstrate one possible context for the ESD protection device of the present invention, and that other contexts in which the device of the present invention is useful will be apparent in any type of apparatus in which ESD protection is desirable. The present invention is especially valuable for protection of microelectronic devices which are incorporated into customer or field replaceable units of any kind.

ESD events typically occur when a person's body becomes highly charged and the individual then touches a grounded object and discharges. The discharge is very similar to the discharge of a capacitor. One commonly-used paradigm for ESD events is called the "Human Body Model," or HBM. An HBM ESD event is simulated by discharging a 100 pF capacitor through 1.5 k$\Omega$ resistance, and the time constant for discharge is about 150 nsec. Therefore, the ESD event is of short duration and high current flow. ESD testing of a device would typically consist of charging up the capacitor to increasingly higher voltages and discharging it through the device until the device fails.

It has been found that a common location for experiencing the effects of electrostatic discharge on a MOS-type printhead is in the area around the bonding pad 32, at the site of the connection to external circuitry by wire bond 11, although other sites within any apparatus where ESD protection would be advisable will be apparent to one skilled in the art. A high voltage experienced at this point is capable of heating the aluminum electrode material of bonding pad 32, and causing an electrical short to the substrate. In order to avoid damage to the printhead, it is necessary to avoid such high-voltage potentials at the bonding pad 32, or else to re-route the current caused by an external electrostatic discharge so that the voltage will not build up on the pad, but rather be safely grounded away form the printhead circuitry, such as into lower substrate 28 and then to ground metallization elsewhere on the surface of the chip. In particular, it is necessary to avoid "hot spots," or localized areas of high current flow, which cause localized overheating and damage in the chip.

Figure 1:
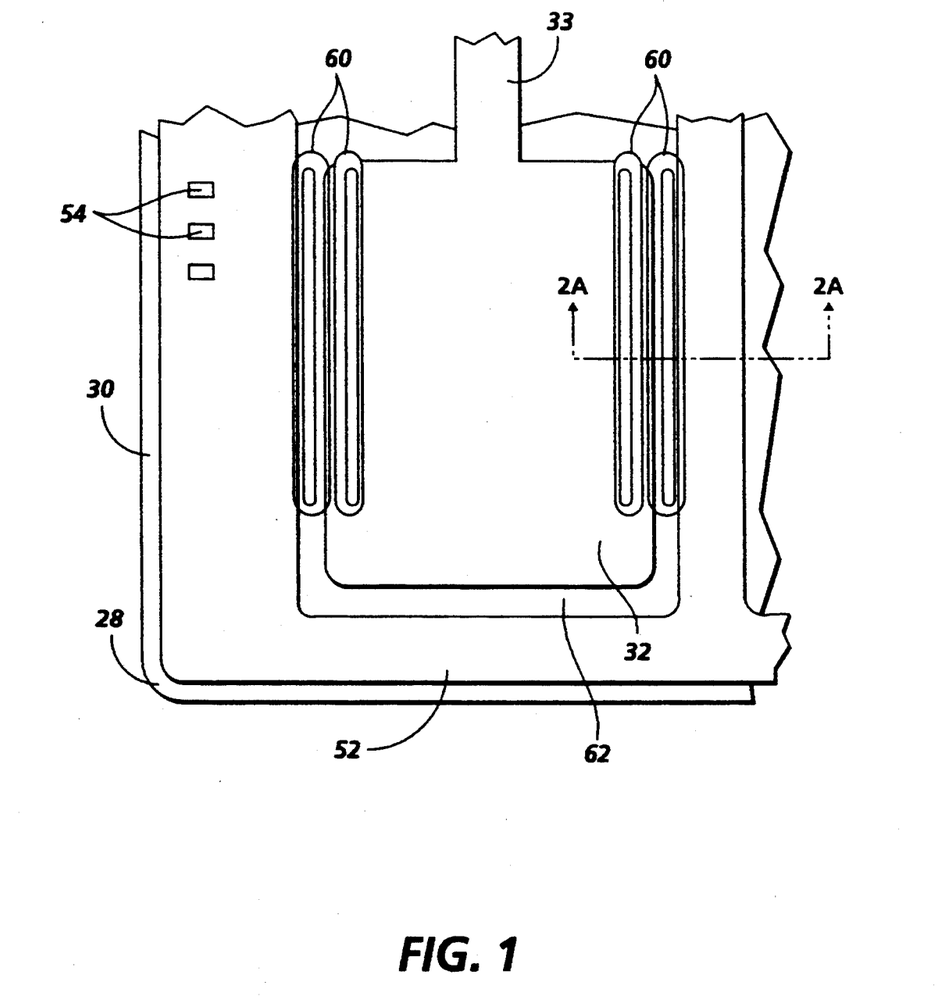
FIG. 1 is a plan view of a bonding pad on a printhead chip, incorporating the features of the present invention therein.

FIG. 1 shows the bonding pad 32, by which the circuitry of the printhead is connected to an external device, as viewed on the surface of a printhead chip. On a typical printhead chip, there may be a large plurality of such bonding pads 32 for external connections. A bonding pad 32 will typically include a lead such as electrode 33 extending therefrom to connect with circuitry as needed in the printhead. A typical dimension of such a bonding pad 32 would be a square of 100 micrometers on a side. The bonding pad 32 is, in a typical MOS arrangement, in the form of a layer of aluminum, etched and situated on oxide grown on a silicon substrate, which is shown in FIG. 1 as the area marked generally as surface 30. In normal operation, external voltage signals entered on bonding pad 32 will be conducted to further circuitry in the printhead through electrode 33. Electrode 33 may be formed on the surface of the chip, as shown, or may connect to further circuitry on the surface of the silicon itself; i.e., as viewed in FIG. 1, by a connection under the bonding pad 32 into the page.

Also on the printhead chip, typically generally around the bonding pads 32, is a ground area indicated as 52. Ground 52, etched into the surface 30, will include one or more ground contacts, shown as 54, which connect to ground, in the form of, for example, heater plate 28, from which the silicon layer surface 30 is disposed.

One purpose of the present invention is to prevent any externally-produced discharge voltages, such as from a typical "static shock" from a human finger, from affecting or damaging any circuitry in the printhead. External high voltages appear as the area around bonding pad 32. The apparatus of the present invention thus protects the circuitry of the printhead, including the bonding pad 32 itself, by restricting the voltage at the bonding pad 32 to be at or below a predetermined amount. If the voltage exceeds the predetermined level, the pads becomes highly conductive and discharges directly to ground thereby limiting the voltage applied to the circuitry through the addressing electrode 33. In order to accomplish this discharge protection, means defining a MOS field-effect device are provided around the perimeter of the bonding pad 32 and a ground surface 52. The existence of parasitic bipolar transistors with MOS devices is well-known. More significantly, the MOS field-effect device will have associated therewith a "parasitic bipolar" which functions as a highly conductive path to ground once the voltage applied to the input pad exceeds a value fixed by the design and process sequence. This parasitic transistor is so configured that, in response to a voltage at the bonding pad 32 in excess of a predetermined amount, the transistor will create a connection between bonding pad 32 and ground 52 so that the excess voltage is redirected to ground and not into the circuitry associated with the printhead (or with any other type of apparatus to be protected).

Figure 2A:
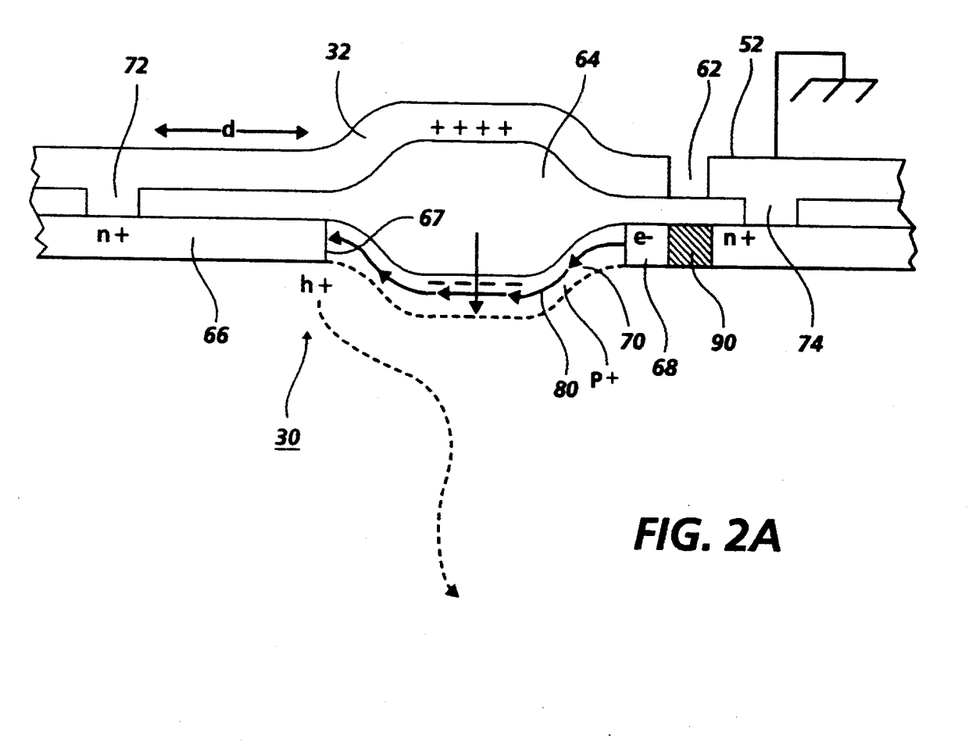
FIG. 2A is an enlarged sectional elevational view of a field-oxide device according to the present invention, taken along the line 2A—2A in FIG. 1 in the direction of the arrows.

As can be seen in FIG. 1, when the structure of the present invention is viewed from above, as through a microscope, the structure of the transistor appears as the elongated ovals shown generally as 60, which are the field oxide devices. The structure corresponding to these ovals is important to one aspect of the invention, and the preferred configuration of a transistor according to the present invention is to at least extend an appreciable distance along an edge (or many edges) of the bonding pad 32. FIG. 2A is a sectional, elevational view along the line 2A—2A in the direction of the arrows in FIG. 1, showing the structure of the MOS field-oxide device and associated lateral parasitic bipolar transistor, disposed between the bonding pad 32 and the ground surface 52, along at least one edge of bonding pad 32.

The general principle by which the parasitic bipolar associated with the field effect device allows ESD protection of bonding pad 30 is described in detail in U.S. patent application Ser. No. 07/879,626, incorporated herein by reference, but will be here briefly reiterated in the context of the present invention. As viewed in the cross section of FIG. 2A, the field oxide device generally indicated as 60 includes a number of layers, which shall be described from top to bottom: the top layer comprises the conductive portions of bonding pad 32 and ground surface 52, which in the preferred embodiment are made of aluminum. A gap 62 exists between the bonding pad 32 and ground surface 52 so that there will not be any direct connection therebetween, which would of course short out the bonding pad 32. Beneath the top conductive layer is an oxide layer 64. This layer 64, typically made of silicon dioxide, is at least several 100 nm thick as shown, in the region of the field oxide device for reasons which will be explained below.

Underneath the oxide 64 are some important elements of the field oxide device 60; such as a drain 66, a source 68, and a channel 70, in the form of a p doped "channel stop implant." When parasitic bipolar conduction is excited, the drain 66 also serves as a collector of electrons, and source 68 serves as an emitter of electrons, while the bipolar base is the p-type substrate and associated, more heavily doped channel stop near surface region. In the embodiment shown, the collector 66 is created by an area of silicon that is n+ doped, adjacent the bonding pad 32; and the emitter is created by an n+ doped area adjacent the surface ground 52. The base of the transistor is a p doped area directly underneath the thick portion of the oxide, shown as 64, formed from the channel stop. In order to complete the connections to the transistor from bonding pad 32 to ground metallization 52, a via 72 is provided to connect the bonding pad 32 to collector 66, and another via 74 is provided to connect the emitter 68 to ground surface 52. Resistance zone 90, shown as a shaded area in FIG. 2A, is an addition to the field effect device 60, and will be described in detail below.

Figure 2B:
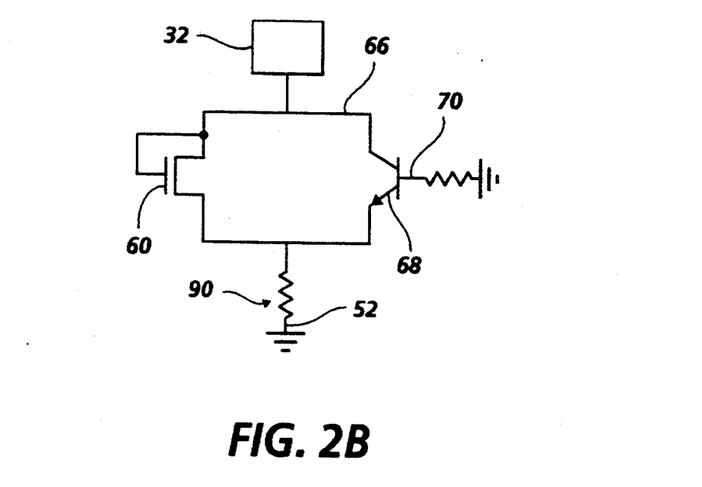
FIG. 2B is a schematic diagram showing the elements of the field-oxide device of FIG. 2A.

The ESD protection device of the present invention for bonding pad 32 is properly understood as a "parasitic bipolar" in association with the field oxide device 60. In any MOS device such as field oxide device 60, a lateral bipolar transistor is present in the substrate. In the preferred embodiment of the present invention, the bipolar transistor is exploited for ESD protection. FIG. 2B is a schematic diagram in which the field oxide device generally shown as 60 is shown separate from and parallel to the parasitic bipolar transistor. In FIGS. 2A and 2B, like reference numerals indicate like elements. As can be seen in FIG. 2B, the collector 66, base 70, and emitter 68 of the bipolar form a transistor parallel with the field oxide device 60. The emitter 68 of the bipolar is the same as the source of the MOSFET; the collector 66 of the bipolar is the same as the drain of the MOSFET; and the base 70 of the bipolar is the substrate on which the field oxide device 60 is formed. Thus, for purposes of the present invention, the characteristics of the field oxide device 60 itself is less important than the characteristics of the bipolar which is parasitic thereto. The goal is for a large ESD event on bonding pad 32 to be discharged through the parasitic bipolar, and not damage the circuit so as to interfere with the subsequent signals passing through bonding pad 32 for purposes of operating the printhead. A second goal is to limit the voltage seen on pad 32 to be less than about 30 V so as to prevent rupture of gate oxide in circuits connected to 32. It is well known that bipolar devices are capable of conducting far larger currents than MOSFET's, especially MOSFET's with thick gate oxides such as layer 64. In fact, the input protection circuit 60 will operate equally well when the pad 32 is not present over oxide layer 64, in which case there is no MOSFET conduction whatsoever.

The bipolar parasitic transistor of the present invention will permit conduction from bonding pad 32 to ground metallization 52 when there is a sufficiently high voltage at bonding pad 32. This connection will be made from bonding pad 32 through via 72, collector 66, base 70, emitter 68, and via 74, to surface ground 52. Ordinarily, when there is not a high potential on the bonding pad 32, signals applied to the bonding pad 32 will be sent, as intended, through electrode 33 in FIG. 1 to control in the desired way, the circuitry of the printhead. When a high voltage appears on bonding pad 32, such as a result of an external electrostatic discharge, a significant charge (here shown as a positive charge) will appear as a concentration of positive charge at the area immediately above oxide 64, as shown by the plus symbols in FIG. 1. This charge on bonding pad 32 in turn creates a concentration of mobile channel electrons in the channel 70, on the opposite side of oxide 64. As is known in the art of MOS technology, this concentration of electrons in the p doped region 70 will cause the MOSFET to become conductive. The arrows 80 shown passing through the channel 70 represent the passage of electrons from source 68 to drain 66. Thus, the connection is formed from bonding pad 32 through transistor 60 to ground surface 52 when a sufficiently high potential is created at bonding pad 32.

The large positive charge on bonding pad 32 causes a channel electron current in the channel 70, on the opposite side of oxide 64. This channel current 70 encounters a high electric field region at the junction between the channel and the drain and the electrons undergo impact ionization to create a hole current flow, indicated in FIG. 2A as drain junction 67. The hole current flow can also be initiated by avalanche breakdown of the drain to substrate junction 67. As the bias on the drain continues to increase, the hole current flow increases due to the higher rate of impact ionization. The hole current must travel to a point distant from the generation point 67 to be collected. As a result of hole current flow through the resistive substrate, the potential in the vicinity of the device increases until the substrate 70 becomes forward biased with respect to the source 68. Electrons in the source (emitter) 70 begin to flow toward the drain (collector) 66. The flow of electrons due to bipolar transistor action generates further holes at the drain junction high field region 67, and these excess holes flow to ground through the substrate 65. The flow of electrons out of the drain junction thus creates a cyclical effect, whereby the holes created by the flow of electrons from the source 68 serve to continue to keep base 70 forward biased. Once again, for a more detailed description of the function of the field oxide device 60 and the parasitic bipolar, refer to U.S. patent application Ser. No. 07/879,626.

The parameters of the field oxide device 60, such as the physical thickness of oxide layer 64, or the concentration and dimension of the dopants in the substrate 65, are chosen for particular desired characteristics. One important characteristic is the voltage that is required to activate the field oxide device 60; that is, the threshold at which the bonding pad 32 becomes clamped and is prevented from damaging the circuitry of the printhead. In typical applications of a thermal ink jet printhead, this threshold is usually between 5 and 24 volts. The specific parameters of the field oxide device 60 are thus chosen accordingly.

An important design consideration for a transistor of the present invention is the maximum possible ESD current surge that may be passed through the field oxide device 60 before failure thereof. As mentioned above, the dominant failure associated with high voltages as would result from external electrostatic discharges are "hot spots" causing physical damage at points along the edges of the bonding pad 32.

The "hot spot" failure is generally the result of aluminum metallization alloying and junction spiking between the pad metallization 32 and diffusion 66 at the via contact 72. Spiking occurs when the aluminum metallization migrates through the diffusion region 66 and contacts the substrate 70, thereby shorting the pad to ground. Spiking is driven by high temperatures. In a practical embodiment of bonding pad 32, the via 72 is a long contact extending substantially the length of each edge of the bonding pad (i.e., extending out of the page in the cross-section of FIG. 2). The aluminum-to-silicon contact between conductor 72 and the diffusion on collector 66 has been known to be a common source of physical failures, such as alloying and spiking between conductor 72 and the diffusion on collector 66. Bipolar conduction processes is liable to cause very localized points of high temperature along the edge of bonding pad 32, which in turn is likely to result in junction alloying and spiking. Generally, it has been found that a key determinant of failure voltage in a field oxide device such as 60 is the distance between via 72 and the drain junction 67, the distance marked d in FIG. 2A. Within certain practical ranges, the greater the d, the higher the failure voltage allowable by the field oxide device 60. When the via is near the avalanche breakdown region, the via is heated and alloying results. When the via is moved far away from the via, the contact resistance of the via itself can be the cause for heating and alloying between the metal and diffusion region of the silicon. In one test, the failure voltage of a field oxide device increased substantially linearly from about 7,000 volts to 12,000 volts (HBM) as d increased from 4.5 to 10 micrometers. One disadvantage of a large d, however, is that significant capacitance is created between the diffusion 66 and the substrate 80. This capacitance may have the effect of acting as a low pass filter for signals entering the printhead circuitry through bonding pad 32.

An important function of the present invention is to ensure the even distribution of current flow along the field oxide device 60 through the elongated via 72, so as to avoid these failure causing current hot spots. This type of failure is addressed by the emitter ballasting feature of the present invention. A second method of avoiding failures will be discussed later.

Figures 3A, 3B, 4:
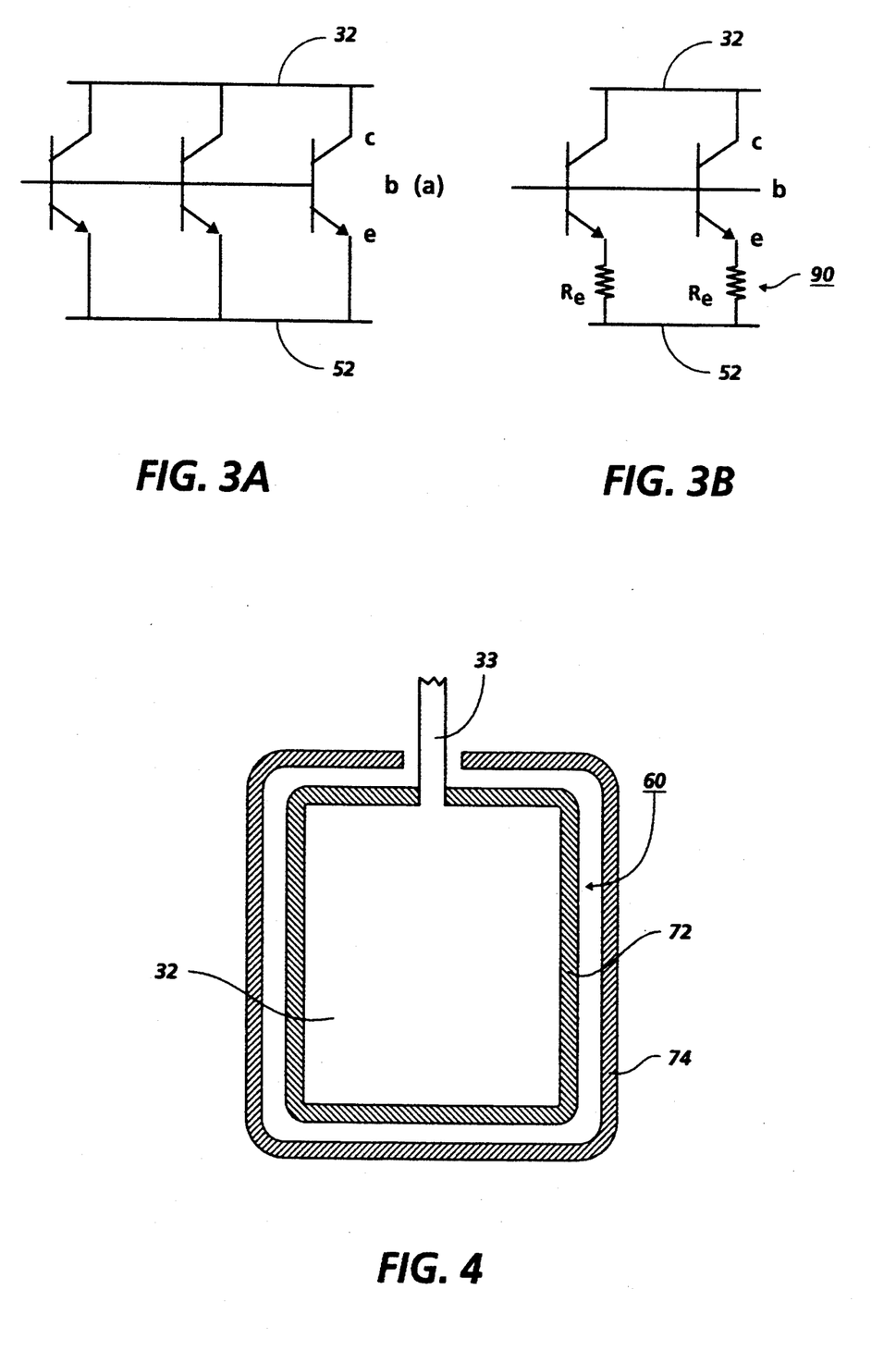
FIGS. 3A and 3B are schematic approximations of a resistance associated with a field-oxide device according to the present invention.
FIG. 4 is a plan view of a bonding pad incorporating a preferred embodiment of the present invention.

To illustrate the concept of emitter ballasting in the context of the present invention, attention is directed to FIGS. 3A and 3B, which are schematic diagrams illustrating the parasitic bipolar as a number of discrete transistors arranged in parallel with the collectors thereof commonly connected to the bonding pad 32 (shown schematically in FIG. 3A) and the emitters thereof commonly connected to the surface ground 52. The channel stop implant 70 shown in FIG. 2A is shown schematically as a common base of the transistors in FIG. 3A. The plurality of discrete transistors are shown to simulate the effect of the continuously-elongated field oxide device 60, as shown in FIG. 1 along one edge of bonding pad 32 and ground metallization 52. When an ESD event occurs on bonding pad 32, the localized hot spot can be understood an excess current flow and resultant failure of a single discrete transistor as shown in FIG. 3A. In both the schematic circuit and in the actual field oxide device 60, a failure at any single location along the field oxide device 60 will effectively destroy the entire device. Bipolar devices exhibit thermal run away. The thermal run away process occurs because heating of a bipolar device causes further conduction. Therefore, as more current flows through one of the several devices in the discrete example or in a small section of the ESD device in the continuous example, the device will heat and become more conductive. This phenomenon is also referred to as "current hogging."

FIG. 3B shows the same conception of the field oxide device 60 as in FIG. 3A, but with the addition of emitter ballasting, in the form of additional resistances, marked $R_e$, associated with the emitter of each discrete transistor and connecting to the surface ground 52. In a physical manifestation of the emitter ballasting, the discrete resistances $R_e$ are in the form of a continuous zone of resistance 90 extending parallel to the edge of bonding pad 32. The purpose of the resistance zone is to ensure a uniform current gain of the parasitic bipolar along the length of the field oxide device 60, and thus create a more even spatial distribution of current along the edge of bonding pad 32. The resistances associated with each discrete transistor, as conceived in FIG. 3B, effectively act as a current limit at that particular location (each particular location symbolized by an individual transistor in FIG. 3B) along a field effect device 60 between an edge of bonding pad 32 and surface ground 52. The resistance on the emitter is very effective in reducing thermal runaway because as current increases, the voltage drop across the resistor increases and the voltage between the base and the emitter decreases. The base emitter voltage controls the current flow from emitter to collector, so the emitter ballast resistor acts as a negative feedback loop. Because no particular spot along a field effect device 60 will be able to reach a high current, no hot spot along any particular point of the field effect device 60 will be created, and thus the chance of failure of the device as a whole is lowered.

Using the MOS technology of the preferred embodiment of the present invention, there are two preferred ways of creating the necessary resistance $R_e$ in the area of the field effect device 60 between the channel stop implant forming base 70 and via 74. One possible technique is simply to increase the distance between the end of base 70 and via 74, thereby increasing the resistance in this area; however, the extension of this resistance has the disadvantages of increasing the necessary "real estate" on a chip. A more effective way of increasing the ballast resistance $R_e$ is to include an n− doped area as a high resistance zone at some point between the base 70 and the via 74, as shown by the shaded area marked 90 in FIG. 2. The added resistance 90 may be included as a doped area within the small n+ doped area of emitter 68, or alternatively may be placed between the edge of base 70 and emitter 68.

In experiments with damaged ESD protection devices wherein the failures are caused by the presence of hot spots which are the result of spiking along the length of one edge of the bonding pad 32, it is found that the area of damage caused by the hot spot is often seen in the same place along the oxide devices and while the location of damage is reproducible, it can also be moved around by device design modifications. In some cases, the hot spot, the area of damage to the field oxide device 60, is in the center of the elongated oxide device; that is, toward the center of the elongated ovals shown in FIG. 1. In this case, there is evidence that the creation of holes in a discharge event tends to create a flow of holes not only from drain 66 to source 68, but also laterally within the field oxide device 60, such as in the top view of FIG. 1 where a flow of holes will be created from the center of each elongated field oxide device towards two ends thereof. This lateral flow of hole current out of the field oxide device is encouraged by the fact that the bulk of hole current flow is along the surface of the chip because the channel stop implant 70 reduces the resistivity by a factor of about 30–40 in the surface region. For this reason, the major path to ground of excess holes within the elongated field oxide device 60 is, in effect, out the ends of the field oxide device 60. Consequently, the highest gain of the parasitic bipolar is in the center of an elongated field oxide device, because of the hole bleed from the ends of the elongated structure, and therefore the failure will consistently occur in the center of the field oxide device. In other cases, when the various parameters of the field oxide device are slightly different, the failures will consistently appear at the ends of the field oxide device, probably caused by the concentration of electric fields at the end of an elongated field oxide device such as that shown by elongated ovals in FIG. 1. The actual mechanisms by which failure of a type of device consistently occur in one location or another are not perfectly understood, but suffice to say that certain design parameters tend to result in consistent types of failures.

FIG. 4 is a plan view of a preferred embodiment of a second aspect of the present invention, wherein the field oxide device 60 not only extends along one dimension of an edge of the bonding pad, but is, in effect, brought around on itself so that the field-oxide-device extends in a single member around as much as possible of the perimeters of the bonding pad 32. Because lead 33 is typically necessary to connect bonding pad 32 to circuitry, it is usually impossible to provide ground metallization and ground via 74 field oxide device 60 which completely encloses the bonding pad 32; but it is possible to extend via 72 in a complete circle because both via 72 and lead 33 are connected to bonding pad 32. As the inner via 72 is the site of maximum impact ionization and is the terminal which cannot be shorted to the substrate as a result of parasitic bipolar discharge, the effects of hole bleed along the field oxide device 60 are substantially obviated even though via 74 may not form a complete enclosure. It is also advisable that the field oxide device is formed with rounded corners, as shown; sharp corners could be sites of unwanted field concentration. It is further preferable that the edges of the bonding pad 32 form a circle, to further evenly distribute current; however, round bonding pads may take up undue amounts of real estate on the chip. When the bonding pad 32 is substantially encircled as shown, lateral flow of excess holes in an ESD discharge is less likely to cause a hot spot which could result in damage to the device, because with a continuous ESD protection device extending entirely around the bonding pad 32, excess holes cannot escape the field effect device and thereby cause hot spots of high energy or temperature.

While this invention has been described in conjunction with a specific apparatus, it is evident that many alternatives, modifications, and variations will be apparent to those skilled in the art. Accordingly, it is intended to embrace all such alternatives, modifications, and variations as fall within the spirit and broad scope of the appended claims.

What is claimed is:

1. An electrostatic discharge protection device for a connector associated with an apparatus, comprising:
   a MOS field oxide device operatively disposed between the connector and ground;
   a bipolar transistor, parasitic to the field oxide device, having a collector, an emitter, and a base, and adapted to conduct current through the collector and emitter in response to a voltage between the connector and ground in excess of a predetermined threshold; and
   a direct electrical connection between the connector and the collector of the bipolar transistor;
   a zone of a predetermined electrical resistance operatively disposed between the emitter of the bipolar transistor and ground, the zone extending along at least one dimension of the connector.

2. A device as in claim 1, wherein the connector comprises a substrate and a bonding pad mounted on the substrate, the bonding pad defining at least one edge substantially on the surface of the substrate.

3. A device as in claim 2, wherein the field oxide device is operatively disposed continuously along an edge of the bonding pad.

4. A device as in claim 3, wherein the field oxide device substantially encircles the bonding pad.

5. A device as in claim 1, wherein the collector of the transistor is connected to the bonding pad.

6. A device as in claim 5, wherein the base of the transistor comprises a channel-stop implant in the substrate.

7. A device as in claim 6, wherein the substrate is electrically grounded.

8. A device as in claim 6, wherein the zone of predetermined electrical resistance comprises a doped area on the substrate.

9. A device as in claim 6, wherein an area on the substrate is doped with the zone of predetermined electrical resistance comprising an area doped oppositely from the first mentioned area on the substrate and being adjacent thereto.

10. An electrostatic discharge protection device for a connector associated with an apparatus, comprising:
    a MOS field oxide device operatively disposed between the connector and ground;
    a bipolar transistor, parasitic to the field oxide device, having a collector connected to the connector, an emitter, and a base, and adapted to conduct current through the collector and emitter in response to a voltage difference between the base and emitter in excess of a predetermined conductivity threshold; and
    a direct electrical connection between the connector and the collector of the bipolar transistor;
    a zone of a predetermined electrical resistance operatively disposed between the emitter of the bipolar transistor and ground, the zone extending along at least one dimension of the connector, so that a current of a predetermined magnitude at the collector creates a voltage drop of a predetermined magnitude between the emitter and ground, said predetermined voltage drop between the emitter and ground causing the voltage difference between the base and emitter to be less than the predetermined conductivity threshold.

11. A device as in claim 10, wherein the connector comprises a substrate and a bonding pad mounted on the substrate, the bonding pad defining at least one edge substantially on the surface of the substrate.

12. A device as in claim 11, wherein the field oxide device is operatively disposed continuously along an edge of the bonding pad.

13. A device as in claim 12, wherein the field oxide device substantially encircles the bonding pad.

* * * * *